United States Patent [19]

Myrberg

[11] Patent Number: 5,796,584
[45] Date of Patent: Aug. 18, 1998

[54] BRIDGE FOR POWER TRANSISTORS WITH IMPROVED COOLING

[75] Inventor: Jan Myrberg, Stockholm, Sweden

[73] Assignee: Telefonaktiebolaget LM Ericsson, Stockholm, Sweden

[21] Appl. No.: 640,256

[22] Filed: Apr. 30, 1996

[51] Int. Cl.$^6$ .................................... H05K 7/20
[52] U.S. Cl. .................. 361/707; 174/16.3; 361/814
[58] Field of Search .................. 455/344, 347, 455/348; 165/80.3, 185; 174/16.3, 35 R, 51, 252; 257/706, 707, 713, 723, 724; 361/690, 704, 707–722, 748, 753, 799, 800, 807, 809, 810, 814, 816, 818, 825

[56] References Cited

U.S. PATENT DOCUMENTS

| | | | |
|---|---|---|---|
| 3,611,046 | 10/1971 | Covert | 317/100 |
| 3,909,679 | 9/1975 | Petri | 317/100 |
| 3,911,327 | 10/1975 | Murari et al. | |
| 4,446,504 | 5/1984 | Jordan | 361/386 |
| 4,557,225 | 12/1985 | Sagues | 123/41.31 |
| 4,665,467 | 5/1987 | Speraw | 361/388 |
| 4,717,990 | 1/1988 | Tugcu | 361/424 |
| 5,001,601 | 3/1991 | Fuoco | |
| 5,134,545 | 7/1992 | Smith | 361/388 |
| 5,291,063 | 3/1994 | Adishian | |
| 5,311,395 | 5/1994 | McGaha et al. | |

*Primary Examiner*—Gerald P. Tolin
*Attorney, Agent, or Firm*—Burns, Doane, Swecker & Mathis, L.L.P.

[57] ABSTRACT

A bridge is used to mount a heat generating electronic component such as an RF power amplifier to a heat sink plate or the like. The bridge is made of heat conductive material to assist in dissipating heat away from the power amplifier while providing an electromagnetic border between input and output sides of the amplifier.

11 Claims, 2 Drawing Sheets

5,796,584

BRIDGE FOR POWER TRANSISTORS WITH IMPROVED COOLING

FOR POWER TRANSISTORS WITH IMPROVED COOLING

BACKGROUND OF THE INVENTION

1. Field of the Invention

The present invention relates generally to a bridge for connecting a power transistor to an underlying material and, more specifically, to a bridge which acts as a heat sink and electromagnetic border between input and output sides of the power transistor.

2. Discussion of Related Art

Many electronics applications use electronic devices such as high power transistors which generate comparatively large amounts of heat. One such application is the radio frequency (RF) power amplifier at the output stage of a radio transceiver. Such a circuit element generates a substantial amount of heat as well as electromagnetic (EM) emissions at both its input side and output side. The EM emissions of the radio frequency components can cause interference with signal processing in other parts of the circuit.

A number of solutions have been proposed for providing a heat sink to dissipate heat from heat generating electrical components. One such proposal is a modular cooling fixture for power transistors disclosed in U.S. Pat. No. 5,001,601 to Fuoco. The fixture includes a carrier plate into which the transistors are mounted such that the transistor lead lines pass through the plate to be connected to a printed circuit board. A chill plate is placed in contact with the carrier plate and recesses are formed in the chill plate so that the transistors project into the chill plate. Cooling fluid passes through the chill plate to dissipate heat. Screws are used to secure the components together.

This type of modular cooling fixture tends to be mechanically complex and cumbersome. It is not suitable for many applications, as it is particularly difficult to implement in modular electronic components which slide into and out of a frame of an electronics cabinet.

Another solution is a mounting assembly for integrated circuits which acts as a heat sink and a clamp such as disclosed in U.S. Pat. No. 3,911,327 to Murari et al. As Murari et al heat sink includes a synthetic-resin flexible spacer body positioned underneath an integrated circuit such that when the integrated circuit is mounted to a printed circuit board it is biased against a heat sink plate. The heat sink plate is secured against the biased integrated circuit by means of nuts and bolts which secure the assembly to the printed circuit board. However, this type of mounting assembly requires manual dexterity and several components and assembly steps. Furthermore, it is possible that the integrated circuit would be damaged during assembly if the bolts are secured too tightly. Such an occurrence could cause the legs of the integrated circuit break their solder connections to the circuit board or the housing of the integrated circuit could be damaged by the excessive clamping pressure.

Another approach is to provide a surface mounted heat sink which is stamped from sheet metal and provided with heat dissipating fingers such as disclosed in U.S. Pat. No. 5,311,395 to McGaha et al. This surface mounted heat sink is positioned on top of an electronic device and is secured to a printed circuit board through a plurality of feet which project through the circuit board and are bent over to secure the arrangement. There are a number of problems with this approach such as the need to exactly position holes in the printed circuit board, the precision with which the parts must be made in order to have meaningful heat conductive contact between the elements, and the relatively complex assembly operation. Furthermore, disassembly of the heat sink from the printed circuit board for replacement of the electronic device would require the feet to be bent back, raising the potential of damaging the printed circuit on the printed circuit board. Additionally, the metallic feet could present potential problems insofar as they are bent over on the printed circuit side of a printed circuit board and have the potential to interfere with the circuit connections or the soldering operation of the feet of the electronic device. Also, this heat sink must be surface mounted to a circuit board and is therefore not appropriate for use with power transistors which are usually mounted separate from printed circuit boards.

SUMMARY OF THE INVENTION

The present invention addresses these and other problems by providing a novel heat sink in the form of a heat conducting bridge which includes a surface contour following the top outline of a heat generating electronic device such as a power transistor. The relatively large contact area between the bridge and the heat generating electronic device permits heat to dissipate from the top of the electronic device through the bridge and has the potential of continuing out through a larger heat dissipating surface.

Also, where the electronic device is an RF circuit element or the like, the bridge can act as an electromagnetic border between input and output sides to separate the electromagnetic emissions from one side from interfering with another. Thus, the bridge can act as an electromagnetic border between circuit elements.

The inventive bridge does not require special mounting, does not require additional holes in the underlying material or particularly tight tolerances during its manufacture. It uses the existing mounting structure for the electronic device and is simple in configuration. It is particularly useful with power transistors because the bridge does not have to be mounted on a circuit board.

Specifically, the present invention is embodied as a bridge for securing a electronic device to an underlying material. The electronic device such as a power transistor includes a heat generating part and a heat conducting plate, the heat conducting plate having first and second mounting flanges extending out from the heat generating part. The bridge includes a central part, a first side extension extending out from a first side of the central part and including a contour such as a bore configured to permit a fastener to secure the first side extension and the first mounting flange to the underlying material. The bridge also includes a second side extension extending out from a second side of the central part and including a contour configured to permit a fastener to secure the second side extension and the second mounting flange to the underlying material. A major surface of the first and second side extensions are in physical contact with the first and second mounting flanges, and the central part is adjacent the heat generating part when the bridge secures the electronic device to the underlying material.

In an alterative embodiment, the present invention may be embodied in a circuit module. The circuit module includes an underlying material such as circuit board/heat sink plate combination onto which circuit elements are mounted, a cover including a top plate and partitions for separating a space between the underlying material and the top plate into compartments when the underlying material and the cover are operatively connected together. At least one electronic device includes a heat generating part and a heat conducting plate, the heat conducting plate having first and second mounting flanges extending out from the heat generating part. At least one bridge secures a electronic device to the underlying material. The bridge is configured as discussed above.

Furthermore, the present invention may be embodied as a method of mounting a electronic device to an underlying material. The method includes the step of providing the electronic device including a heat generating part and a heat conducting plate, the heat conducting plate having first and second mounting flanges extending out from the heat generating part. The method further includes the step of providing a bridge having a central part, a first side extension extending out from a first side of the central part and including a contour configured to permit a fastener to secure the first side extension and the first mounting flange to the underlying material, and a second side extension extending out from a second side of the central part and including a contour configured to permit a fastener to secure the second side extension and the second mounting flange to the underlying material. The method also includes the step of fastening the electronic device to the underlying material by securing with fasteners the first and second side extensions to the first and second mounting flanges to the underlying material, wherein a major surface of the first and second side extensions are in physical contact with the first and second mounting flanges and the central part is adjacent the heat generating part when the bridge secures the electronic device to the underlying material.

BRIEF DESCRIPTION OF THE DRAWINGS

The present invention will now be described with reference to the exemplary embodiments illustrated in the accompanying drawings in which.

DETAILED DESCRIPTION

Figure 1:
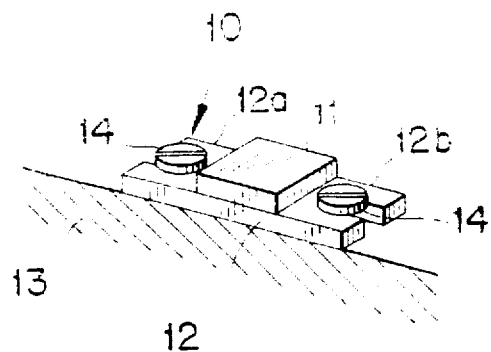
FIG. 1 is a perspective view of a conventional electronic device such as a power transistor.

FIG. 1 illustrates an electronic device which generates heat when operating. Specifically, the illustrated electronic device is a power transistor 10 including a heat generating part 11 which provides the transistor function and a heat conducting plate 12. The heat conducting plate 12 includes first and second mounting flanges 12a and 12b extending outward from transistor part 11. These flanges 12a and 12b conduct heat away from the transistor part 11 and are also used to secure the transistor 10 to underlying material 13. On forward and rear sides of the transistor part 11 (orthogonal to the flanges), electronic leads connect the transistor part 11 to other circuit elements.

Figure 4:
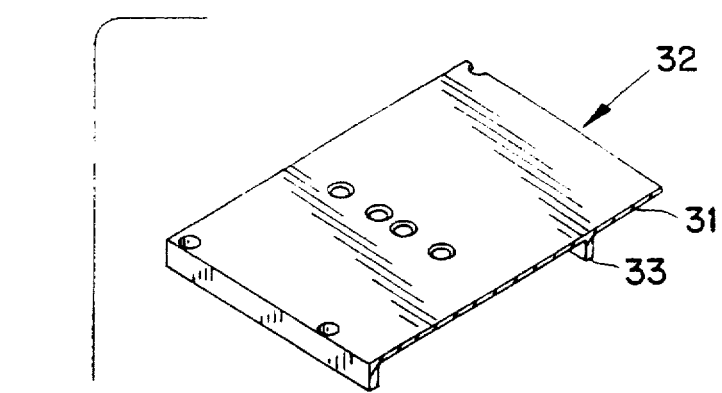
FIG. 4 is a right side, exploded perspective view of cut-away portions of a heat sink plate into which printed circuit boards are placed in a circuit module and a cover.

The power transistor 10 is conventionally connected to the underlying material 13 by means of screws 14. The power transistor 10 may be placed in a hole in and electrically connected to a printed circuit board also mounted on the underlying material 13. The underlying material 13 may be a heat sink plate made of heat conductive material onto which are mounted printed circuit boards or other electronic devices. Such a heat sink plate is illustrated in FIG. 4, further discussed below.

Figure 2:
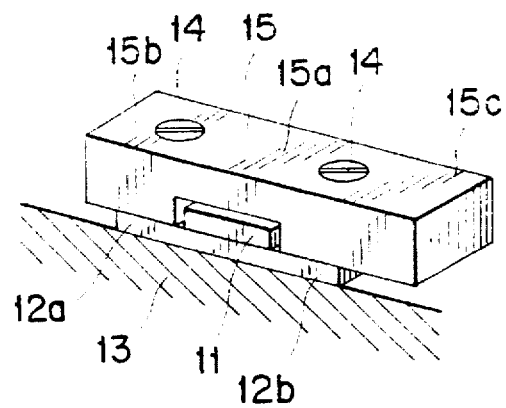
FIG. 2 is a perspective view of a first embodiment of the present invention in its assembled form with an electronic device and underlying material.

The present invention is embodied in a bridge 15 such as shown in FIG. 2 which follows the top outline of the transistor 10 with an approximately 0.5 mm space between the transistor part 11 and a central part 15a of the bridge 15. A first side extension 15b and a second side extension 15c of the bridge 15 are connected in physical contact with the two mounting flanges of the heat conductive plate 12 of the transistor 10. There is a large contact area between the first and second side extensions 15b and 15c and the first and second mounting flanges 12a and 12b which provides a path for heat to dissipate through the bridge 15 and continue out into a larger surface such as the cover 32 shown in FIGS. 3 and 6, if one is being used. The bridge is made of a heat conducting material and dimensioned to act as a heat sink.

The bridge 15 includes one or more bores or holes through which the mounting screws 14 pass. Naturally, any suitable form of fastener could be used, such as a combination of nuts and bolts or rivets. The mounting screws 14 also pass through the first and second mounting flanges of the transistor 10 and into the underlying material 13. Thus, the bridge 15 secures the transistor 10 to the underlying material 13 without requiring an additional or separate fastening mechanism. By this mounting method, good heat conductive contact over a relatively large area between the two flanges 12a and 12b of the transistor 10 and the two side extensions 15b and 15c is established.

The bridge 15 may be made of any heat conductive material such as aluminum, copper, iron, or any of a myriad of other materials. A prototype of the bridge was made of aluminum and gave a reduction of approximately 5° C. for an RF power amplifier. As illustrated, the bridge is made of a homogeneous material, but it can take the form of component parts joined together. A further improvement is to fill the 0.5 mm space between the central part of the bridge 15a and the heat generating part 11 of the transistor 10 with a heat conducting elastic material such as elastic silicon filler.

In applications where the power transistor 10 is used in the output stage of a radio transceiver, the input RF signal is provided at one power level and the output RF signal is provided at a significantly higher output level. The input and output RF signals can interfere with one another and other circuit elements.

The bridge 15 may also function as an electromagnetic border between the input and the output sides of such a transistor, which can reduce EMC disturbance between the two sides. In such a case, the bridge is made of a material capable of providing shielding from electromagnetic fields.

Figure 3:
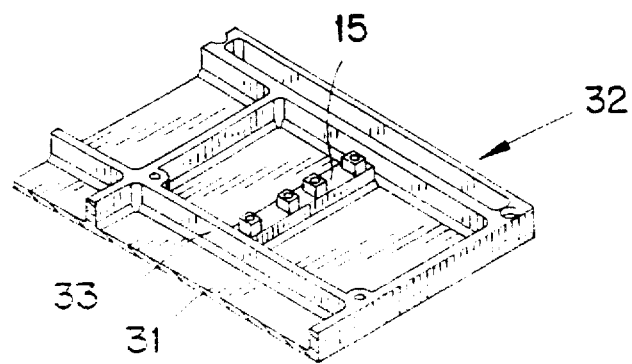
FIG. 3 is a left side perspective view of a cut-away portion of a cover of a circuit module which includes a bridge in accordance with the present invention.

The bridge's function as a border between the input and output sides of the transistor to reduce EMI disturbances between the two sides may be better obtained with the transistor placed in a sealed compartment. In this arrangement, the bridge 15 divides a compartment into two separate cells. Such an embodiment is shown in FIG. 3 wherein a cover 32 including a top plate 31 made of sheet material and a series of partitions 33 which divide the space between the top plate 31 and the underlying material 13 when the cover 32 and the underlying material 13 are assembled together. These compartments are conventionally used to electromagnetically separate the various functional blocks of the circuits in the circuit module.

As illustrated in FIG. 3, the bridge includes four side extensions to secure two power transistors 10 positioned side by side to the underlying material 13. The relative position of the transistors 10 in a compartment of the module is illustrated in FIG. 4. In this example, the underlying material 13 is a composite of a heat sink plate made of a heat conducting material such as aluminum onto which are mounted various printed circuit boards 16. The printed circuit boards 16 are separated by the compartments as formed by the partitions 33 of the cover 32 as shown in FIG. 3. By positioning the cover 32 adjacent to the heat sink plate 13, it can be seen that the bridges 15 span the compartment in which the transistors 10 are placed, thus effectively dividing the compartment into two cells with respect to electromagnetic field effects.

Figure 5:
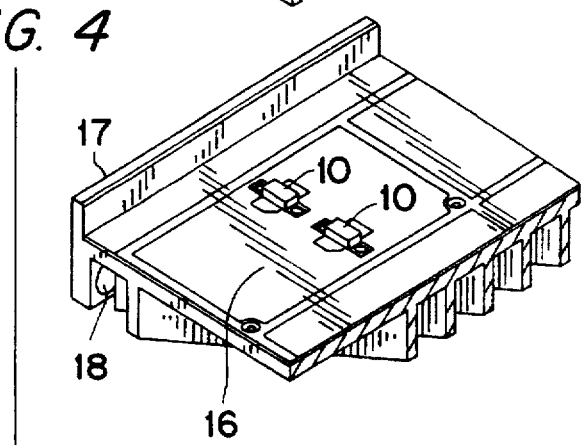
FIG. 5 is a front view of a face plate of a circuit module.
Figure 5:
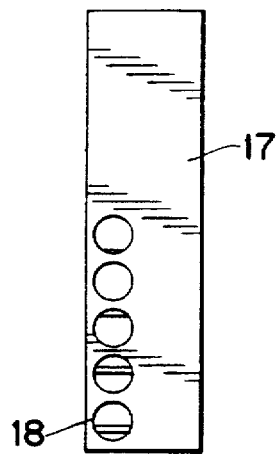
Figure 6:
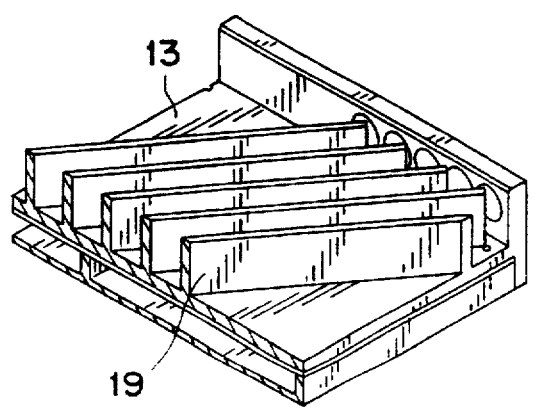
FIG. 6 is a left side perspective view of a cut-away portion of an assembly of the heat sink plate and the cover shown in FIG. 4.

Also shown in FIG. 4 is the back surface of the face plate 17 shown in FIG. 5. FIG. 5 also shows the air intake port 18 of the module. The air intake port 18 of the module is also shown in FIG. 6 together with the cooling fins 19 which direct a cooling fluid such as air over the back surface of the heat sink plate 13. The configuration of the cooling fins 19 as shown in FIG. 6 is but one preferred configuration.

Figure 7:
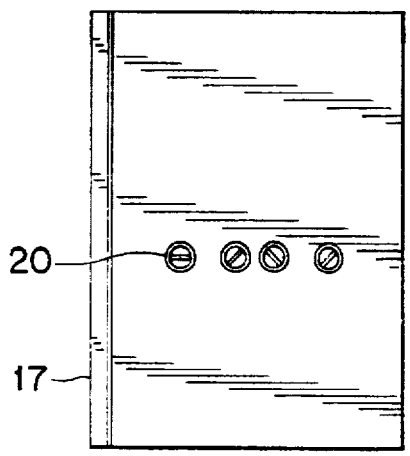
FIG. 7 is a plan top view of the cover shown in FIG. 3.

For completeness, the top view of the cover 32 is shown in FIG. 7. It can be seen that a series of screws secure the cover 32 to the heat sink plate 13. As can be seen at reference number 20, four screws are used in conjunction with the bridge 15 to secure the two power transistors 10 shown in FIG. 4 within the module.

As can be seen from the foregoing description, the present invention provides good heat dissipation on the transistor's bottom side, as conventionally done, as well as its top side, which is not known in the prior art in the manner disclosed herein. It also potentially provides effective EMI protection between the circuit elements. Furthermore, the present invention prevents damage to the solder points during assembly because the screws as they are tightened do not tend to rotate the transistor.

While a power transistor has been mentioned by way of example, the bridge disclosed herein can be used in conjunction with other heat generating components, such as high power resistors and the like.

While the invention has been described in detail with respect to selected embodiments, it should be understood that the invention is not limited to the selected embodiments. Rather, many modifications and variations would present themselves to those skilled in the art without departing from the scope and spirit of this invention, as defined in the appended claims.

The invention claimed is:

1. A circuit module comprising:
   an underlying material onto which circuit elements are mounted;
   a top plate; and
   partitions located in a space between said underlying material and said top plate separating said space into compartments with said underlying material and said top plate operatively connected together, wherein said partitions include
   at least one electronic device including a heat generating part and a heat conducting plate, said heat conducting plate having first and second mounting flanges extending out from said heat generating part; and
   at least one bridge securing an electronic device to an underlying material, said bridge comprising:
   a central part;
   a first side extension extending out from a first side of said central part and including a contour configured to permit a fastener to secure said first side extension and said first mounting flange to said underlying material; and
   a second side extension extending out from a second side of said central part and including a contour configured to permit a fastener to secure said second side extension and said second mounting flange to said underlying material,
   wherein a major surface of each of said first and second side extensions are in physical contact with said first and second mounting flanges and said top plate and said central part is adjacent said heat generating part when said bridge secures said electronic device to said underlying material.

2. A circuit module according to claim 1, wherein said central part, said first side extension and said second side extension of said bridge are integrally formed of a homogeneous material.

3. A circuit module according to claim 1, wherein a profile of said central part, said first side extension and said second side extension follow a profile of a surface of said electronic device which said bridge is designed to secure to said underlying material.

4. A circuit module according to claim 1, wherein said fasteners are screws and said bridge includes holes through which said screws pass.

5. A circuit module according to claim 1, wherein said bridge is made of a heat conductive material.

6. A circuit module according to claim 1, wherein said bridge is made of a material capable of providing shielding from electromagnetic fields.

7. A circuit module according to claim 1, wherein said bridge is made of at least one of the following group of materials: aluminum, copper, iron, or combinations thereof.

8. A circuit module according to claim 1, wherein said electronic device is a power electronic device.

9. A circuit module according to claim 1, wherein said electronic device is a power amplifier which amplifies a radio frequency signal for radio transmission.

10. A circuit module according to claim 9, wherein said bridge separates an input side from an output side of said electronic device.

11. A circuit module according to claim 9, wherein said bridge divides a compartment of said circuit module into two cells separating an input side from an output side of said electronic device.

* * * * *